US012808948B2

(12) United States Patent
Dwivedi et al.

(10) Patent No.: US 12,808,948 B2
(45) Date of Patent: Nov. 24, 2026

(54) METHOD FOR DETECTING A SHORT CIRCUIT AND CONTROL UNIT

(71) Applicant: Danfoss Power Electronics A/S, Gråsten (DK)

(72) Inventors: Sanjeet Kumar Dwivedi, Gråsten (DK); Thiruvenkadam Madhulingam, Chennai (IN); Anandarao Bongu, Oragadam (IN)

(73) Assignee: DANFOSS POWER ELECTRONICS A/S, Gråsten (DK)

( * ) Notice: Subject to any disclaimer, the term of this patent is extended or adjusted under 35 U.S.C. 154(b) by 125 days.

(21) Appl. No.: 18/366,272

(22) Filed: Aug. 7, 2023

(65) Prior Publication Data

US 2024/0045000 A1 Feb. 8, 2024

(30) Foreign Application Priority Data

Aug. 8, 2022 (DE) ......................... 102022119945.2

(51) Int. Cl.

*G01R 31/52* (2020.01)
*G01R 31/72* (2020.01)
*H02H 7/08* (2006.01)
*H02P 29/024* (2016.01)

(52) U.S. Cl.

CPC ............. *G01R 31/52* (2020.01); *G01R 31/72* (2020.01); *H02H 7/0833* (2013.01); *H02P 29/024* (2013.01)

(58) Field of Classification Search

CPC ...... G01R 31/52; G01R 31/72; G01R 31/343; G01R 31/346; H02H 7/0833; H02P 29/024
USPC .......................................................... 324/546
See application file for complete search history.

(56) References Cited

U.S. PATENT DOCUMENTS

2021/0167715 A1* 6/2021 Tagawa ................ H02H 7/1216
2023/0003798 A1* 1/2023 Yuasa .................. G01R 31/343

FOREIGN PATENT DOCUMENTS

CN 105487012 A 4/2016
CN 107851995 A 3/2018
CN 111936874 A 11/2020
CN 112305421 A 2/2021
CN 113647013 A 11/2021
CN 111917349 B 6/2022
DE 112019007189 T5 * 3/2022 ............ H02P 29/024

(Continued)

OTHER PUBLICATIONS

Liu Jun, Zhao Chencong, Xie Zhouhua, Zhou Feihang. "An Overview on Control of Wind Power Grid-connected Inverter Under Unbalanced Grid Fault". China Academic Journal Electronic Publishing House. vol. 50. No. 8. 2020. China. pp. 65-73. DOI : 10.19457/j.1001-2095.dqcd19489 Please see English abstract.

(Continued)

*Primary Examiner* — Arleen M Vazquez
*Assistant Examiner* — Robert P Alejnikov, Jr.
(74) *Attorney, Agent, or Firm* — McCormick, Paulding & Huber PLLC

(57) ABSTRACT

A method for detecting a short circuit in a winding of an electric motor being driven by a drive, the method includes measuring respective phase currents of the windings, transforming the phase currents to negative sequence components, and comparing the negative sequence components with respective baseline values. A corresponding control unit is further disclosed.

19 Claims, 5 Drawing Sheets

(56) References Cited

FOREIGN PATENT DOCUMENTS

| | | | |
|---|---|---|---|
| EP | 3264593 | A1 | 1/2018 |
| EP | 3783376 | A1 | 2/2021 |
| WO | 2019202651 | A1 | 10/2019 |
| WO | 2021166042 | A1 | 8/2021 |

OTHER PUBLICATIONS

Chinese Office Action in connection with Chinese Patent Application No. 202310861788.4, dispatched Sep. 23, 2026, 8 pages, and its English Summary, 4 pages. 12 pages total.

* cited by examiner

METHOD FOR DETECTING A SHORT CIRCUIT AND CONTROL UNIT

CROSS-REFERENCE TO RELATED APPLICATION

This application claims foreign priority benefits under 35 U.S.C. § 119 from German Patent Application No. 102022119945.2, filed Aug. 8, 2022, the content of which is hereby incorporated by reference in its entirety.

TECHNICAL FIELD

The invention relates to a method for detecting a short circuit in a winding of an electric motor being driven by a drive and to a corresponding control circuit.

BACKGROUND

Electric motors are used to drive many different applications. They typically comprise several windings, which are loaded with electric current so as to drive a rotating equipment. Control units are typically used to control and/or drive such electric motors.

SUMMARY

It is an object of the invention to provide for a method for detecting a short circuit in a winding of an electric motor and to provide a corresponding control unit. This is achieved by a method and a control unit according to the respective main claims. Preferred embodiments can be derived from the respective dependent claims.

The invention relates to a method for detecting a short circuit, especially an interturn short circuit, in a winding of an electric motor, especially a multiphase ac electric motor, being driven by a drive. The method comprises the following steps:

- measuring respective phase currents of the windings,
- transforming the phase currents to negative sequence components,
- comparing the negative sequence components with respective baseline values, and
- detecting a short circuit if the negative sequence components deviate more than a respective absolute or relative threshold from the respective baseline value.

The method has been shown to provide for an easy and reliable way of detecting a short circuit in a winding of an electric motor. This can especially be used in order to increase security during operation, as a short circuit in a winding is detected typically before it causes problems, for example due to increased heat production, especially due to formation of a hot spot and/or subsequent failure of the motor.

The method may be used to detect a short circuit in a winding of any phase of the electric motor.

A short circuit is especially an event in which current flows along a path along which it should not flow, especially because the path is isolated. Especially a short circuit can be present between two windings. Typically, each winding can be loaded with electric current separately. This can be used in order to drive the electric motor in the desired way. Transformation to negative sequence components can especially be done by a suitable transformation, e.g. a Fourier transformation, for example as explained further below. The negative sequence components give a suitable indication of the presence of a short circuit. The baseline values can be set such that they correspond to typical negative sequence components of an electric motor that does not have a short circuit. In case a short circuit is present, the negative sequence components deviate significantly from these baseline values. This can be detected by the described comparison between the baseline values and the negative sequence components. An absolute or a relative threshold can be used. Especially, a respective baseline value can be set separately for each negative sequence component. This does not preclude that the baseline values may be equal to each other.

Transforming the phase currents to negative sequence components may especially be performed using a rotating reference frame.

This rotating reference frame may especially rotate at an output frequency of the drive. The output frequency may especially be a frequency with which the windings are loaded with electric current consecutively. Using this output frequency for a rotating reference frame has shown to yield good results for the negative sequence components for the purpose of short circuit detection.

Especially, the baseline values may be given dependent upon the output frequency. This allows for separate baseline values for different output frequencies. For example, a table may be used linking different output frequencies to different baseline values. Alternatively, a mathematical formula can be used for that purpose.

A negative sequence component may correspond to a current component or harmonics rotating in opposite direction to a main rotating magnetic field inside an air gap of the motor. Such a current component or harmonics typically has values different from baseline values corresponding to a non-fault state, if a short circuit occurs.

Especially, the method may further comprise the following step:

- measuring a dc link voltage.

This dc link voltage can be used in order to further enhance the calculation and in order to increase reliability in short circuit detection. Examples are given below.

The dc link voltage may be measured at rectified output voltages and/or at connection points between respective diodes. This corresponds to a typical implementation of a drive, where the dc link voltage can be measured.

The method may further comprise the following steps:

- transforming the dc link voltage to a reference frame rotating with a reference frame rate, especially with a synchronous reference frame rate, and
- obtaining a resonance signature by taking a square root magnitude of the dc link voltage in the reference frame, especially after transformation in the reference frame.

Such a resonance signature may be used for further evaluation. Especially, a low pass filtering may be performed before transforming the dc link voltage in the reference frame.

Especially, the dc link voltage in the reference frame may be passed through a low-pass filter before taking a square root magnitude. This can be used in order to smooth the dc link voltage, especially a dc link voltage resonance signature.

The reference frame may especially rotate with an output frequency of the drive, multiplied by a value given by 2/n, wherein n is an integer value. Especially, n may be an integer value of a maximum output frequency divided by a grid frequency.

The detection of a short circuit may especially be paused while a grid unbalance is detected, especially by detecting presence of harmonics in the resonance signature. Such harmonics in a resonance signature typically indicate a state in which a short circuit detection is not possible in a reliable manner.

A short circuit may also be detected if the drive operates in a resonance band and no grid unbalance is detected based on the resonance signature. It has been found that if the drive operates in a resonance band without generating a grid unbalance, this is an indication for a short circuit. A grid unbalance can also be called an unbalance in mains supply voltage.

Each resonance band may be defined around a power grid frequency multiplied by an integer.

The power grid frequency may especially be a frequency of an alternating current supplying the drive, especially supplying input power to the drive. If the drive operates in a resonance band around such a value given by the power grid frequency multiplied by an integer, it is typical that an electric motor will show a grid unbalance. If such a grid unbalance does not occur, this is an indication for a short circuit.

The invention relates also to a control unit for an electric motor, the control unit being configured to perform a method as disclosed herein. With regard to the method, all embodiments and variations can be applied.

The invention relates further to a non-tangible computer-readable storage medium comprising instructions causing a processor to perform a method as disclosed herein. With regard to the method, all embodiments and variations can be applied.

Especially, a method is proposed herein to detect early stator winding inter-turn short circuit fault, especially in multiphase AC motors.

For example, an electric motor may be embodied as surface permanent magnet synchronous motor (SPMSM), interior permanent magnet synchronous motor (IPMSM), synchronous reluctance motor (SynRM), or asynchronous motor (ASM). The method does not need any additional sensor, it may use a measured dc link voltage and/or motor currents by voltage/current sensors typically already available in VFDs (Variable Frequency Drives) or drives, and these sensors are typically enough to capture information of any stator winding short circuit inter-turn fault of the AC motors.

A method is proposed to monitor the insulation condition of the multiphase AC motor stator winding. It diagnoses weak insulation condition and on the same time the algorithm is robust enough that it is not generating any false alarm during stringent condition such as weak grid condition. The unbalance voltage or weak grid condition may generate similar fault signature as generated during stator winding inter-turn short circuit condition. This may especially happen due to the fact that unbalance grid condition generates unequal voltage at different phase windings of an AC machine. This unbalance of voltage causes a fault signature even in the healthy condition of the stator winding insulation. The proposed method or algorithm detects the grid unbalance condition by monitoring voltages and/or currents applied to the motor.

The method may be equally effective in overmodulation and deep field weakening range of operation. An algorithm may be used to decompose voltage and current symmetrical components, and phase "u", phase "v", and phase "w" currents and voltages may be used to determine negative sequence and positive sequence components of current and voltages. This ensures accurate and reliable detection of stator winding phase turn-turn short circuits.

The method may especially be based on an algorithm which utilizes fixed time constant low-pass filters. These filters are effective and are applied to positive and negative sequence components of current and voltage for accurate determination of stator winding phase turn-turn short circuit fault.

The proposed method detects sequence components generated in the motor phase voltage and motor winding current during stator phase short circuiting of inter-turn fault. Reference frame transformation may be used to filter out negative and positive sequence components of stator winding currents and stator phase voltages.

The magnitude of stator winding phase turn-turn short circuit fault is typically directly proportional to the number of turns involved in the short circuit, and this fault signature magnitude may only be a fraction of full load nominal current of motors. The fault signature is typically expressed in percent of a nominal current of a motor.

The health of stator winding insulation is typically monitored by comparing negative sequence components of a stator current to its baseline value (the negative sequence component of a current measured at commissioning of the drive). The spectrum of fundamental and harmonics components of a current vector including negative sequence components may be significant. The proposed algorithm may detect the negative sequence components generated in the motor winding current during inter-turn short circuit fault of stator insulation by transforming measured currents to a reference frame fixed to negative direction synchronous speed (−WsRef).

The transformation to a negative direction synchronous frame results in negative sequence harmonics and may be transformed in a dc part as shown further below. Suitable low bandwidth low-pass filters may be used to filter out negative sequence components from positive sequence and other harmonics components of the current.

A weak grid condition or unbalance in main supply voltage may also result in negative sequence components of a motor current which may be used as an indicator of stator winding insulation health degradation. This phenomenon may be pronounced as soon as the grid frequency (Wgrid) is exactly equal to the stator rotating field frequency (WsRef), or one of its integer multiples, and the motor is loaded. The operating point may generate a resonance in motor current and voltage. Hence, it may pose a new challenge on the condition monitoring of stator winding insulation. In this algorithm, a new method is proposed which utilizes sequence components of drive output voltages and sequence components of motor winding current to differentiate from negative sequence components of current generated by a grid or a short circuit of stator winding phase turns.

Especially, inbuilt current and voltage sensors of a drive may be used.

The method may use calculated applied motor voltage and measured motor winding currents by voltage/current sensors already available in typical implementations. Condition-based information of any stator winding short circuit inter-turn fault of an AC motor may be provided. The method can monitor sequence components of available electrical signals to monitor condition of stator windings of multiphase AC motors. The method is robust for weak grid condition or unbalance mains voltage condition for generating true warning and alarm signals related with the stator winding phase inter-turn fault. The fault is independent of the advance parameter of multiphase AC motor.

In the following, basic steps in order to arrive from a measurement of three winding currents ias, ibs, and ics to an actual short circuit detection are described.

In a first step, three phase currents are measured through current sensors inbuilt in the drive, or control unit. The dc link voltage is also measured. The dc link voltage is especially measured at a rectified output of a fixed voltage and fixed frequency supply.

In a second step, three phase currents are transformed to negative and positive sequence symmetrical components through the help of a rotating reference frame, rotated at an output frequency of the drive.

Components Ineg and Ipos are symmetrical component values for the three phase currents and the magnitude of Ineg values shows unbalance in the current and indication of the stator winding inter-turn short circuit fault. These values are, in the present case, not calculated using FFT (Fast Fourier Transformation), instead the algorithm uses the reference frame transformation technique.

In a third step, the dc link voltage is transformed to a new reference frame rotating at the rate proportional to a factor of kTransform and output frequency of the drive. The output of this transformation is passed through a low-pas filter and square root magnitude of a quadrature component (Vx and Vy) is obtained as resonance signature.

The reference transformation may be done according to an integer ratio of maximum frequency of the inverter to the grid frequency.

The reference frame transformation may be carried out based on the value of ratio according to the following formula.

$k=(2/1, 2/2, 2/3, 2/4 \ldots 2/n)$, where $n$=Integer of (foutMax/fgrid)

For (a) 0.5*2*pi*fgrid=<WsRef=<1.5*2*pi*fgrid, k=2/1
(b) 1.5*2*pi*fgrid<WsRef=<2.5*2*pi*fgrid, k=2/2
(c) 2.5*2*pi*fgrid<WsRef=<3.5*2*pi*fgrid, k=2/3
(d) 3.5*2*pi*fgrid<WsRef=<4.5*2*pi*fgrid, k=2/4
(e) 4.5*2*pi*fgrid<WsRef=<5.5*2*pi*fgrid, k=2/5
(f) 5.5*2*pi*fgrid<WsRef=<6.5*2*pi*fgrid, k=2/6 kTransform provides the multiplying factor which is used to define a rotating speed of the reference information frame.

WsRef is typically an angular electrical output frequency of the electric drive. It is defined as output electrical frequency of the drive multiplied by 2×π. Mathematically it is shown as (2×π×fout).

k is a constant to determine kTransform. Its value may be given by k=kTransform.

In a fourth step, the healthy monitor baseline values for measured sequence components of current are monitored and stored in the drive.

The baseline values may be stored in the % magnitude of the negative sequence component of the current Ineg. For different output frequencies of the drive, the "Ineg" value is computed and stored in the lookup table. For example, for a 100 Hz range, "Ineg" maybe stored by running the drive at 5 Hz, 10 Hz, 15 Hz, . . . until 100 Hz, and $I_1$ to $I_{20}$ are stored values of "Ineg" for healthy motor at the time of commissioning. A possible table is given as an example in the following:

| | fout in Hz | | | | | | | | | | | | | | | | | | | |
|---|---|---|---|---|---|---|---|---|---|---|---|---|---|---|---|---|---|---|---|---|
| | 5 | 10 | 15 | 20 | 25 | 30 | 35 | 40 | 45 | 50 | 55 | 60 | 65 | 70 | 75 | 80 | 85 | 90 | 95 | 100 |
| Ineg in % of Nom | $I_1$ | $I_2$ | $I_3$ | $I_4$ | $I_5$ | $I_6$ | $I_7$ | $I_8$ | $I_9$ | $I_{10}$ | $I_{11}$ | $I_{12}$ | $I_{13}$ | $I_{14}$ | $I_{15}$ | $I_{16}$ | $I_{17}$ | $I_{18}$ | $I_{19}$ | $I_{20}$ |

Any deviation from the healthy amplitude of negative and positive sequence symmetrical component of current will lead to an information of short circuit between the inter-turn of specific phase of the motor phase winding.

In the following, an algorithm for obtaining a frequency spectrum is described.

In a first step, symmetrical components are calculated using the reference frame theory described by Park and Clarke (DQ0 transformation).

In a second step, the three phase output currents, dc link voltage, and output frequency of the drive are used as input to this algorithm.

In a third step, the negative sequence component which is rotating in opposite direction to the rotating magnetic field at the air gap of the motor (e.g. 50 Hz in reverse magnetic field direction, also denoted as −50 Hz) is determined. This component is rotating in the backward direction and hence denoted by negative frequency in reference frame transformation.

The negative frequency denotes, with regard to its physical meaning, that the particular symmetrical component of harmonics is rotating in the opposite direction to the main rotating magnetic field inside the air gap of a motor. In case of healthy motor with balance winding and equal healthy turns in each phase there is no negative sequence component of the current. However, in case of inter-turn short circuit fault in any one of the stator winding of the motor, the unbalance in current occurs and it is reflected by the increased magnitude of negative sequence component in the current flowing in the motor winding.

A weak grid condition can especially be defined as the three phase voltage output not being in balance, either in (a) voltage magnitude (must be equal for balance case), or in (b) phase angle difference (must be 120° for balance case), or in (c) both voltage magnitude and phase angle difference.

In reality, the power transmission and distribution are subject to an unwanted condition where certain load disturbance, faults, malfunctioning of switch gears, or other factors changes the magnitude of phase angle of the AC mains supply voltage. This is known as weak grid condition.

The weak grid condition may have influence on the motor symmetrical component of current, if the output frequency of the drive is very close (or e.g. equal within a band of approximately 5%) to grid frequency (AC mains supply voltage frequency), and the grid is weak (or unbalanced). This operating condition generates the negative sequence component of the current even though there is no inter-turn short circuit fault inside the stator winding of the motor. It can generate false positive warning and alarm.

The dc link voltage with reference frame transformation may especially be used specifically for determining the unbalance voltage of the grid, which is a specific form of the "weak grid condition". The grid unbalance phenomenon can be triggered by grid side fault in any one phase or phases of the supply system, or due to weak grid condition.

In theory, a weak grid is susceptible for frequency voltage mains unbalance. The terms "unbalance in mains supply voltage" and "weak grid condition" are used in this document to represent the condition of unbalance in mains voltage. These terms in this document are reflecting that the voltage magnitude and phase angle of supply voltage waveform is either equal in magnitude or in phase or it is unequal in magnitude or phase angle difference, or both.

Thus, unbalance in mains supply voltage can be regarded as a specific form of weak grid condition.

For obtaining a decomposition algorithm, three phase output currents of the motor and the rotor position angle may be fed to the alpha-beta to x-y transformation block (Park and Clarke transformation), where these three phase currents are converted to x and y components of the negative sequence current, if transformation is carried in the negative direction or rotation, or with negative rotation angle theta_r, and if the transformation is carried in the positive direction with positive rotation angle theta_r, then x and y components of positive sequence components of the current are obtained. These respective x and y components of negative and positive sequence components of currents are passed with a low-pass filter to re-move any low frequency noise. After low-pass filtering, the square root component of the x and y currents in the respective rotating direction provide the Ineg and Ipos value (negative direction Ineg, positive direction Ipos).

The primary function of a drive is to control the speed and torque of the application connected with it, for example an electric motor. Hence, as per requirement of the load, motor speed and torque reference may be changed by the drive. During this change, a drive may operate either very close to sometimes exactly at the frequency, which is equal to double of the grid frequency. If grid is unbalanced, then this operating point triggers very low frequency oscillation in the drive output current. It is known as resonance phenomenon.

The meaning of term frequency of the drive falling in the response band means, that the drive is operating a certain output frequency, at which the output frequency of the drive is equal or very close to the double of grid frequency or integer multiples of it, which triggers the resonance.

In the following, it is described how a resonance band is determined.

It was observed, that when a drive output frequency is equal to or very close to the double of a grid frequency, the motor may be in the resonance band. So the output frequency of the drive is monitored for equality or closeness to the double of standard supply frequency, which may, for example, be either 50 Hz or 60 Hz. Depending upon regional settings, the resonance band may be determined as 1.05*fgrid*n to 0.95*fgrid*n, where n is variable (n=1, 2, 3, . . . , up to integer of (foutMax/fgrid) (foutMax=maximum output frequency, fgrid=grid frequency)), fgrid is typically either 50 Hz or 60 Hz. The algorithm may check whether a motor is running within resonance band and then it may calculate Vdc2f as described further below with respect to FIG. 4, to determine if there is any resonance happening. The Vdc2f calculation method and resonance flag response are shown in FIGS. 8*a* and 8*b*, respectively.

The process for determining an inter-turn short circuit fault described herein may especially be used if the drive is not operated within the resonance band. Additionally, an inter-turn short circuit fault may be determined, in case the drive is operated within the resonance band and there is no unbalance in mains supply voltage condition detected.

BRIEF DESCRIPTION OF THE DRAWINGS

The invention will now be further described with respect to the accompanying drawings.

DETAILED DESCRIPTION

Figure 1:
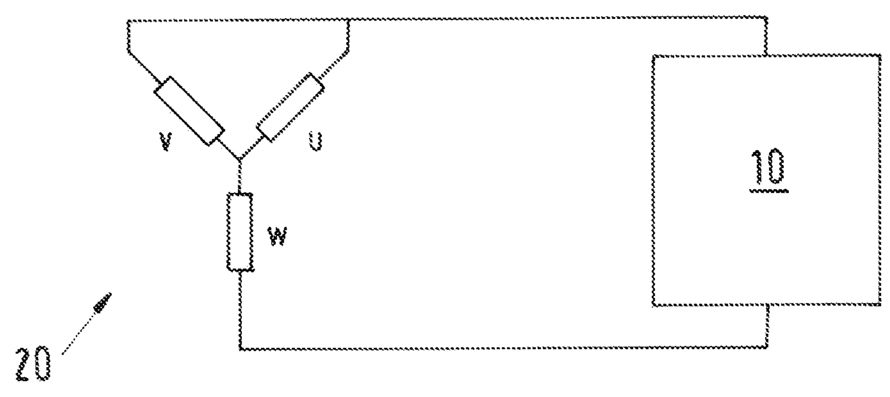
FIG. 1 shows an electric motor and a control unit.

FIG. 1 shows schematically a control unit 10 and a connected electric motor 20. The motor 20 has three phases u, v, w that are connected to the control unit 10. The phases are connected to each other at a central point. The control unit 10 is typically configured to provide electric power to the electric motor 20, and also to perform certain control and surveil-lance functions.

When a motor is connected to the control unit 10, or at any other point in time when it is required, the control unit 10 may perform a method as described herein.

Figure 2:
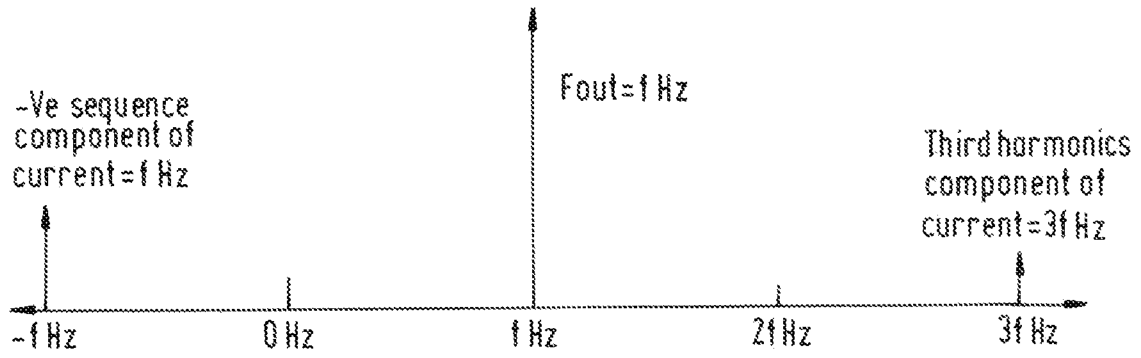
FIG. 2 shows a frequency spectrum.

FIG. 2 shows an ASM stator winding inter-turn fault and generated harmonics spectrum. It can be seen that negative frequency components are present, which are, in the present case, represented by the upwards pointing arrow at the left end of the horizontal axis. This can be used in order to determine a short circuit fault.

Figure 3:
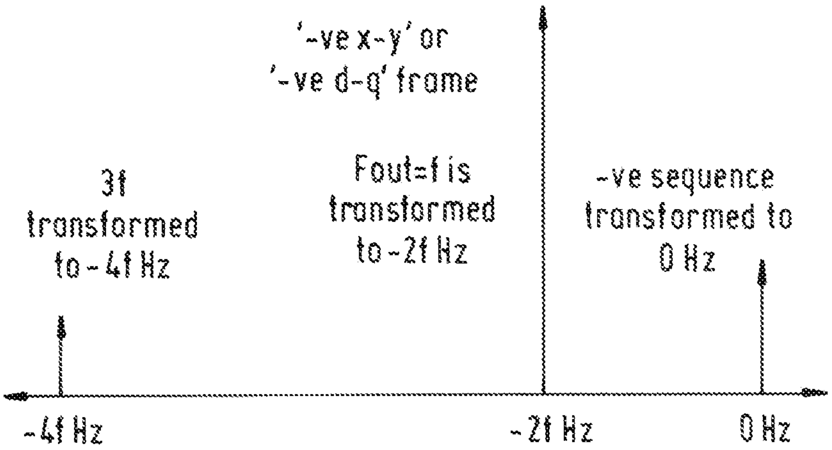
FIG. 3 shows another frequency spectrum.

FIG. 3 shows negative sequence and third harmonics components of stator winding current as transformed to 0 Hz and −4 f. Also there, negative sequence components are present. Also components at 0 Hz are present.

Figure 4:
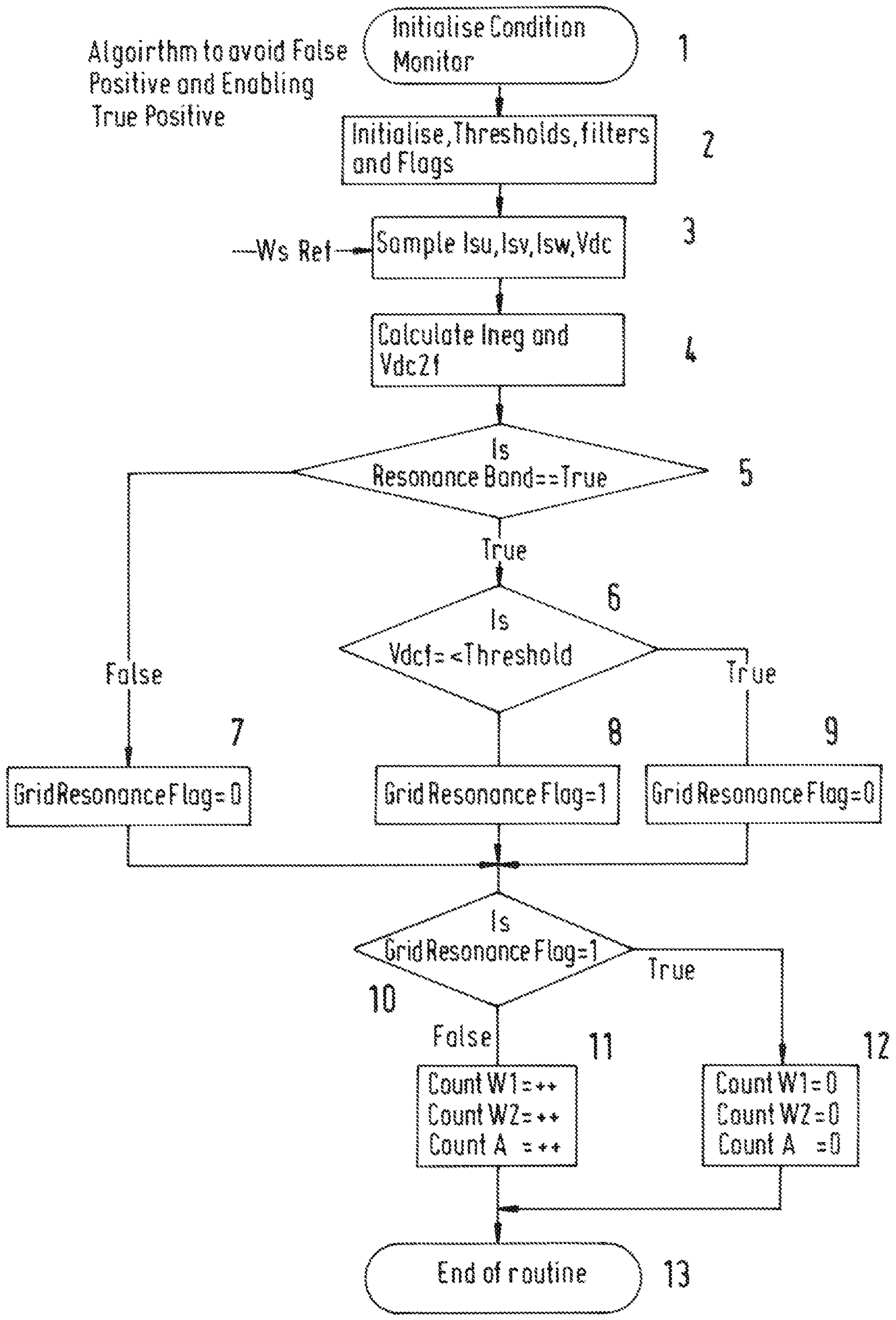
FIG. 4 shows a flow diagram.

FIG. 4 shows a flow diagram of a typical process, which will be described in the following.

The block 1 initializes the proposed condition monitoring function. The block 13 ends the routine.

Block 2 sets the threshold limit for detecting stator winding inter-turn fault.

Block 3 of the flow chart shown in FIG. 4 samples three phase winding currents Isu, Isv, Isw, of the motor, dc link voltage, duty ratios $d_u$, $d_v$, $d_w$ of voltage of phase u, phase v, and phase w, and an output frequency of the drive.

Block 4 transforms these winding currents and voltages to sequence components of voltage and current and calculates negative sequence components of current and signal which correspond to unbalance or weak grid condition Vdc2f.

Block 5 determines if a drive output frequency lies within the resonance band. As shown in the flowchart of FIG. 4, this block decides, whether the output frequency WsRef of the drive falls within the resonance band (frequency of grid close to output frequency of the drive, Wgrid=WsRef). If the output frequency of the drive lies outside the resonance band than the drive knows there is no influence of grid on the stator winding monitoring signal as shown in Block 7, the grid resonance flag is set to zero.

Block 6 activates when the drive output frequency falls within the resonance band or a pre-defined frequency band. Now the drive monitors a grid resonance indicator signal Vdc2f and if it is less than the preset threshold value again the drive determines that grid condition is not influencing the stator winding monitoring signal. If this condition is true, it is then used in block 8 to indicate that drive should not generate stator winding warning and alarm because false positives can be generated due to unbalance grid condition.

Block 9 gets activated in case of a positive logic decision of block 6 and the drive now determines that the grid is healthy or the operating point of the drive is outside of a frequency range where the grid can influence the stator winding monitoring signal and in this case false warning and alarm cannot be generated by the drive.

Block 10 determines if a drive output frequency lies in the resonance band and if the resonance flag is set i.e. resonance has occurred, then stator winding signal monitoring time counters are reset to zero as shown in Block 12 in order to avoid false positive warnings and alarms.

Block 11 counts time duration for warning and alarm signal when there is no resonance condition and the stator winding monitoring signal is higher than the threshold limit of warning or alarms.

Figure 5:
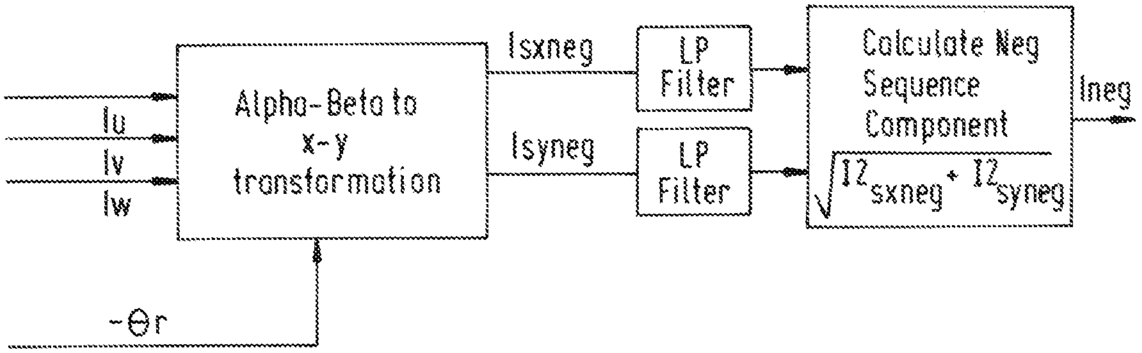
FIG. 5 shows first signal processing entities.
Figure 6:
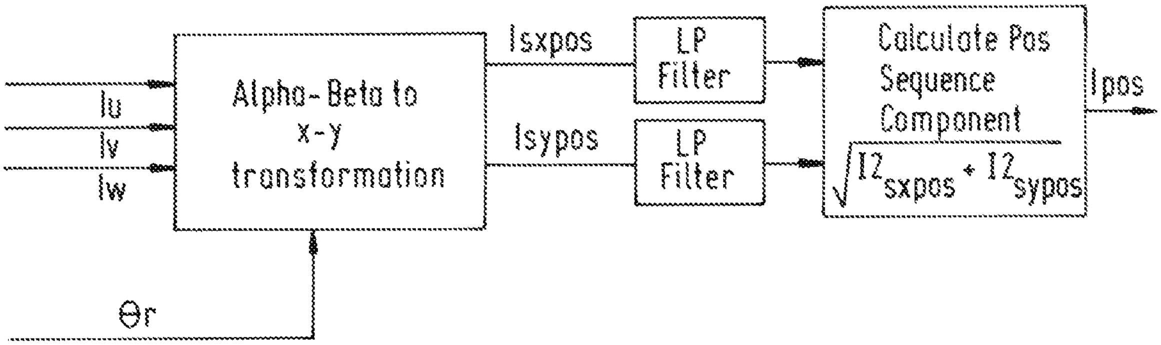
FIG. 6 shows second signal processing entities.
Figure 7:
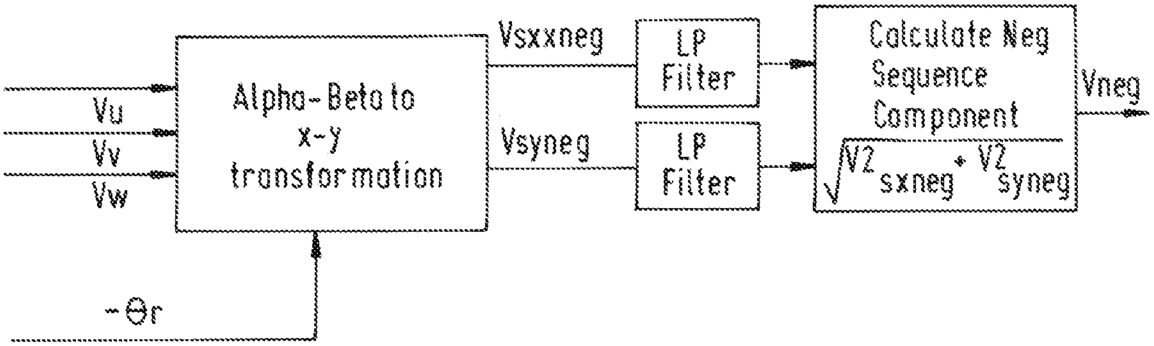
FIG. 7 shows third signal processing entities.

In the process in block 11, a status flag is generated for warning level-1, warning level-2, or alarm in case of stator winding faults occurring, fault signatures crossing a threshold, or magnitude and time duration of these faults exceeding pre-programmed countervalue. Block diagrams of methods used to extract negative and positive sequence components of current and voltage are shown in FIGS. 5 to 7. The process utilizes simple low-pass filters to filter out high frequency components from transformed negative and positive sequence x and y components of currents and negative sequence components of voltages. Especially, the process shown in these figures and the following description can be used in order to extract sequence components, as mentioned elsewhere herein.

Figure 8A:
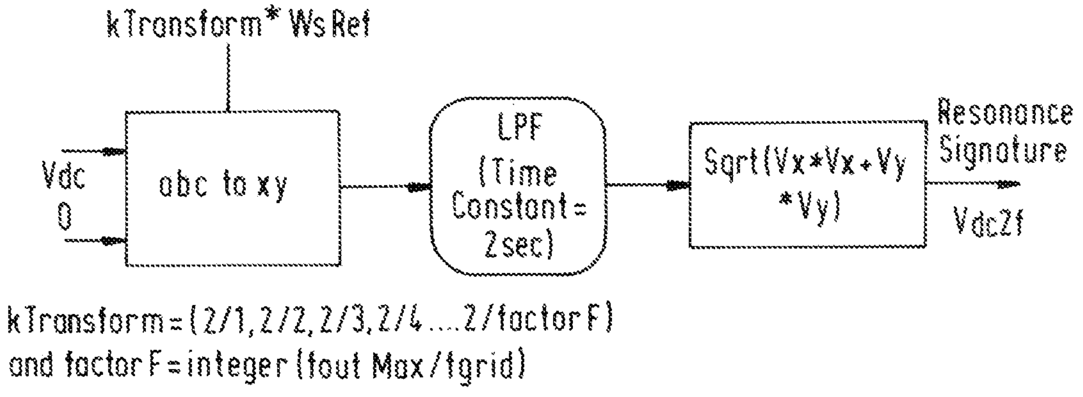
FIGS. 8*a* and 8*b* show a Vdc2f calculation and a corresponding flag response.
Figure 8B:
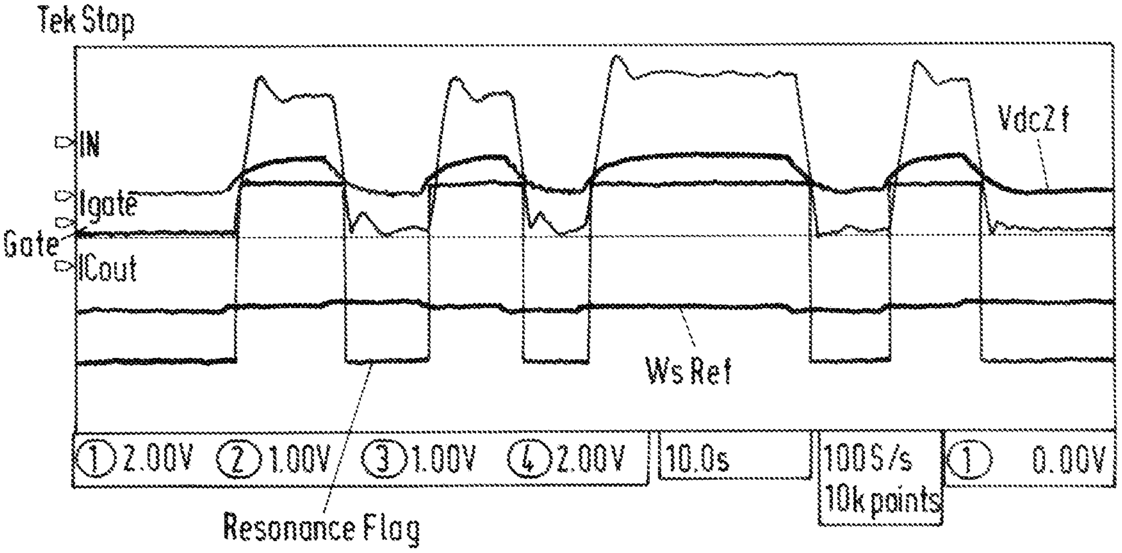

FIG. 8*a* shows the block diagram of the method how to calculate Vdc2f from the dc link voltage Vdc and by using the output frequency of the drive for reference frame transformation. The corresponding FIG. 8*b* shows that the resonance flag is generated when the drive is running within the resonance band and the gird is unbalance i.e. running at 750 rpm (it is an 8 pole motor) corresponds to a 50 Hz output frequency of motor. The diagram of FIG. 8*b* was made with a 3% unbalance in the grid, the speed was changed from 740 rpm to 760 rpm and back to 740 rpm in repetitive steps with 50% load.

Processing starts with an Alpha-Beta to x-y transformation of currents I or voltages V for the respective phases u, v, w. Regarding the currents, negative sequence components Isxneg, Isyneg (FIG. 5), and positive sequence components Isxpos, Isypos (FIG. 6) are calculated for the axes x, y. Regarding voltages, negative sequence components Vsxxneg, Vsyneg are calculated for the axes x, y. The respective values are low-pass (LP) filtered and are subject to a calculation of the square root of the sum of the squares of the respective x and y components. The results are negative sequence components Ineg of the current, positive sequence componence Ipos of the current, and negative sequence components Vneg of the voltage.

The proposed algorithm works during normal grid conditions as well as in case of weak grid (unbalance mains voltage condition). The algorithm may perform detection of stator winding inter-turn short circuit faults for ASM, PMSM and SynRM. The algorithm is able to discriminate healthy and faulty stator winding with both unbalance and balance grid condition.

The proposed algorithm was verified through experimentation and observation.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for detecting a short circuit in a winding of a plurality of windings of an electric motor being driven by a drive, the method comprising the following steps:

providing electric power to each of the windings of the electric motor, measuring respective phase currents of each of the windings, determining negative sequence components of the measured phase currents, determining if the drive is operating in a resonance band, generating a short circuit warning and/or alarm signal if the drive is not operating within the resonance band and if any of the negative sequence components deviate more than a respective absolute or relative threshold from the respective baseline value, and generating a short circuit warning and/or alarm signal if the drive is operating within the resonance band and if any of the negative sequence components deviate by less than the respective absolute or relative threshold from the respective baseline value.

2. The method according to claim 1, wherein determining the negative sequence components is performed using a rotating reference frame, rotating at an output frequency of the drive.

3. The method according to claim 2, wherein the baseline values are given dependent upon the output frequency.

4. The method according to claim 2, wherein a negative sequence component corresponds to a current component or harmonics rotating in opposite direction to a main rotating magnetic field.

5. The method according to claim 2, wherein the method further comprises the following step:

measuring a dc link voltage of the drive.

6. The method according to claim 1, wherein the baseline values are given dependent upon the output frequency.

7. The method according to claim 6, wherein a negative sequence component corresponds to a current component or harmonics rotating in opposite direction to a main rotating magnetic field.

8. The method according to claim 6, wherein the method further comprises the following step:

measuring a dc link voltage of the drive.

9. The method according to claim 1, wherein each of the negative sequence components corresponds to a current component or harmonics rotating in opposite direction to a main rotating magnetic field.

10. The method according to claim 9, wherein the method further comprises the following step:

measuring a dc link voltage of the drive.

11. The method according to claim 1, wherein the method further comprises the following step:

measuring a dc link voltage of the drive.

12. The method according to claim 11, wherein the method further comprises the following steps:

converting the de link voltage to a reference frame rotating with a reference frame rate, and obtaining a resonance signature by taking a square root magnitude of the dc link voltage in the reference frame.

13. The method according to claim 12, wherein the de link voltage in the reference frame is passed through a low pass filter before taking a square root magnitude.

14. The method according to claim 12, wherein the reference frame rotates with an output frequency of the drive, multiplied by a value given by 2/n, wherein n is an integer value.

15. The method according to claim 14, wherein n is in integer value of a maximum output frequency divided by a grid frequency.

16. The method according to claim 12, wherein the generating a short circuit warning and/or alarm signal is paused while a grid unbalance is detected by detecting presence of harmonics in the resonance signature.

17. The method according to claim 12, wherein a short circuit warning and/or alarm signal is generated if the drive operates in a resonance band and no grid unbalance is detected based on the resonance signature.

18. The method according to claim 17, wherein the resonance band is defined around a power grid frequency multiplied by an integer.

19. A control unit for an electric motor, the control unit being configured to perform the method according to claim 1.

* * * * *